(12) United States Patent
Pasek

(10) Patent No.: US 8,648,607 B2
(45) Date of Patent: Feb. 11, 2014

(54) MONITORING POWER USAGE

(75) Inventor: Richard Pasek, Watertown, MA (US)

(73) Assignee: Amperic, Inc., Brookline, MA (US)

( * ) Notice: Subject to any disclaimer, the term of this patent is extended or adjusted under 35 U.S.C. 154(b) by 324 days.

(21) Appl. No.: 12/985,125

(22) Filed: Jan. 5, 2011

(65) Prior Publication Data

US 2011/0166719 A1    Jul. 7, 2011

Related U.S. Application Data (60) Provisional application No. 61/292,223, filed on Jan. 5, 2010.

(51) Int. Cl.
*G01R 31/08* (2006.01)

(52) U.S. Cl.
USPC .......................................... 324/522; 324/535

(58) Field of Classification Search
USPC .......................................................... 324/522
See application file for complete search history.

(56) References Cited

U.S. PATENT DOCUMENTS

| | | | |
|---|---|---|---|
| 5,301,112 A | | 4/1994 | Gold et al. |
| 6,054,849 A | * | 4/2000 | Collier et al. ................. 324/133 |
| 6,323,652 B1 | * | 11/2001 | Collier et al. ................. 324/508 |
| 6,483,291 B1 | | 11/2002 | Bhateja et al. |
| 6,528,957 B1 | | 3/2003 | Luchaco |
| 6,618,772 B1 | | 9/2003 | Kao et al. |
| 6,631,309 B2 | | 10/2003 | Boise et al. |
| 7,043,543 B2 | | 5/2006 | Ewing et al. |
| 2007/0276548 A1 | | 11/2007 | Uzunovic et al. |

OTHER PUBLICATIONS

Consumer Reports, Energy Monitors, Mar. 2009, p. 1, www.consumerreports.org.*
"Tweet-a-Watt" (http://www.ladyada.net/make/tweetawatt/) updated on Oct. 20, 2009.
"Envi" Current Cost—Reducing your energy bills so you can live a greener life! (http:currentcost.com/product-cc128.html) found on Nov. 2, 2009.
"Meters" Watts up? Products: Meters (https://www.watsupmeters.com/secure/products.php?pn=0&wai=0&more=2) found on Nov. 2, 2009.
"Software" Watts up? Products: Software (https://www.wattsupmeters.com/secure/products.php?pn=1#) found on Nov. 2, 2009.

* cited by examiner

*Primary Examiner* — Thomas F Valone
(74) *Attorney, Agent, or Firm* — Thomas | Horstemeyer, LLP (57) ABSTRACT

Disclosed are various embodiments for monitoring power usage. A plurality of power usage cycles are monitored using a controller. Each of the power usage cycles includes a plurality of current draw periods. Each of the current draw periods has a different average current draw. A current draw reading is determined to be abnormal when the current draw reading meets a threshold associated with one of the current draw periods, while the one of the current draw periods is predicted to be active. An action is performed when the current draw reading is determined to be abnormal.

32 Claims, 5 Drawing Sheets

MONITORING POWER USAGE

CROSS-REFERENCE TO RELATED APPLICATION

The present application claims priority to U.S. Provisional Application No. 61/292,223 entitled "MONITORING POWER USAGE" and filed Jan. 5, 2010, which is incorporated herein by reference.

BACKGROUND

A number of electrical devices are present in a modern household. While some may be used directly by the user, others could be in use for years at a time. Many machines are subject to periodic breakdown, and the likelihood of breakdown increases as the age and hours of use increase. Many machines also require periodic maintenance such as, for example, lubrication or cleaning. The periodic maintenance may be essential for the operation of the device.

Machines that are most vulnerable to breakdown are often the most expensive. Such machines may contain large motors which must be run continuously. Nonstop operation may create conditions for the machine to become disabled. Foreign objects or lack of maintenance may result in catastrophic damage to the machine, which not only destroys the device but also could create a fire hazard.

Many devices operate continuously for the ease, comfort, and safety of loved ones. As an example, on hot summer days, it is common for pet owners to leave air conditioners on while they are away so their pets will stay cool. If the air conditioner were to fail, the pet may be harmed. As another example, a failed heating system may result in burst water pipes during the cold of winter. Therefore, failure of such electrical devices can potentially have many negative results.

In modern society, people are also interested in reducing energy consumption. However, people are prone to forgetfulness, making it very common for devices to be left on by accident. In addition, some may want a device to be on upon arrival to their home. Because of lack of a remote control, the device may be left on for an entire day. Thus, a large amount of energy may be wasted.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the disclosure. Moreover, in the drawings, like reference numerals designate corresponding parts throughout the several views.

DETAILED DESCRIPTION

The present disclosure relates to systems and methods for monitoring power usage. In particular, monitoring power usage of a device may allow one to make decisions based on the energy efficiency of the device. For example, by monitoring power usage using the embodiments described herein, a user may decide to exchange one device for another based on its power usage. Furthermore, monitoring the power usage of a device may allow a user to determine when the device is potentially malfunctioning. As an example, a malfunctioning device may draw more power than a device that is functioning correctly. As another example, a malfunctioning device may draw less power than a device that is functioning correctly.

In some cases, the differing power usage may be a constant error or may appear based on a power consumption cycle associated with the device. As an example, an electrical device that consumes one level of power constantly when it is turned on may begin to consume a greater level of power constantly when a component inside the device becomes shorted or is otherwise malfunctioning. As another example, an electrical device that cycles between a first level of power for a first duration and a second level of power for a second duration may be malfunctioning when the first level of power is used beyond the first duration. Thus, power usage may be correlated with device malfunction even when the power usage does not exceed some constant high threshold or fall below some constant low threshold.

By monitoring power usage to assess whether an electrical device is malfunctioning, costly problems can be avoided. As an example, a device that is using an excessive amount of power in a malfunctioning state may be repaired or replaced, thereby reducing power consumption. As another example, a device that is malfunctioning may be turned off in order to prevent further damage to the device. As yet another example, by determining when a device is malfunctioning, external consequences, such as lack of air conditioning, computer services, telephone services, etc., may be addressed. In the following discussion, a general description of the system and its components is provided, followed by a discussion of the operation of the same.

Figure 1:
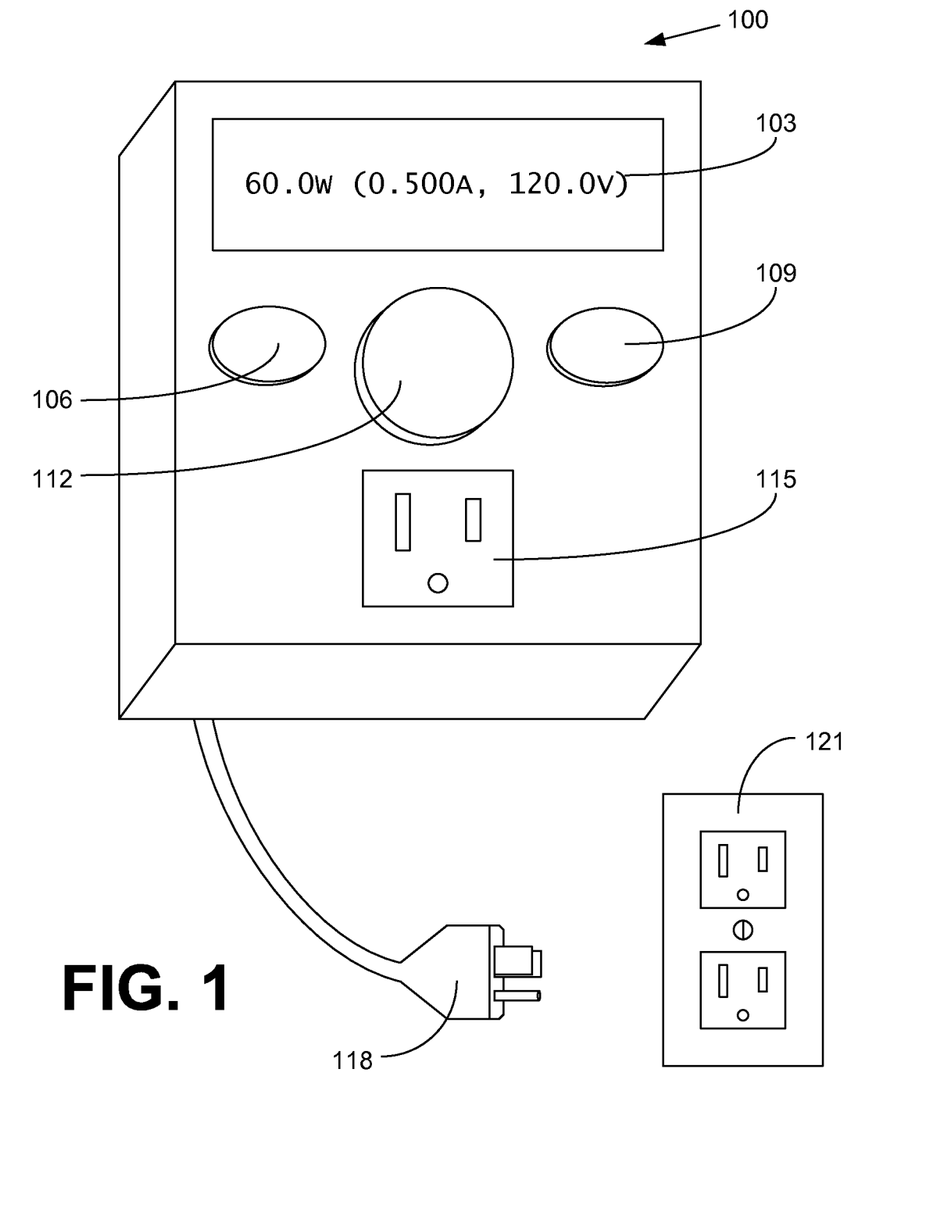
FIG. 1 is a drawing of a power monitoring system according to one embodiment of the present disclosure.

With reference to FIG. 1, shown is a power monitoring system 100 according to one embodiment. The power monitoring system 100 is illustrated as a small box configured to be plugged into a power source, such that an electrical device or power strip may be plugged into the box to receive power. The plug 118 is configured to connect to a power source 121, which then provides operating power for the power monitoring system 100 and power to a receptacle 115. Although the plug 118 is illustrated as attached to a cord, in other embodiments the plug 118 may be integrated into a housing of the power monitoring system 100. In other embodiments, the power monitoring system 100 may be battery powered.

The power monitoring system 100 is configured to monitor the power used through the receptacle 115, for example, by a device or combination of devices. In other embodiments, multiple receptacles 115 may be provided in order to monitor multiple devices. In other embodiments, the power monitoring system 100 may be configured to monitor power usage of a current-carrying conductor by fitting around the current-carrying conductor instead of being in series with the power load.

The display 103 may be configured to display, for example, status information about the power connection to the device.

Such status information may include, but is not limited to, power drawn, current drawn, voltage of the power connection, an active power consumption mode, a time associated with an active power consumption mode, and/or other status information. The display 103 may also display configuration information when the power monitoring system is being configured. In the exemplary embodiment of FIG. 1, buttons 106, 109 and control 112 are provided as three examples of input devices in order to configure and control the operation of the power monitoring system 100. In one embodiment, the control 112 may be a rotary selector mechanism. It is understood that the power monitoring system 100 may comprise any number or configuration of user input devices, including, but not limited to, touchscreens, voice recognition systems, keyboards, keypads, buttons, selectors, toggle switches, etc.

Figure 2:
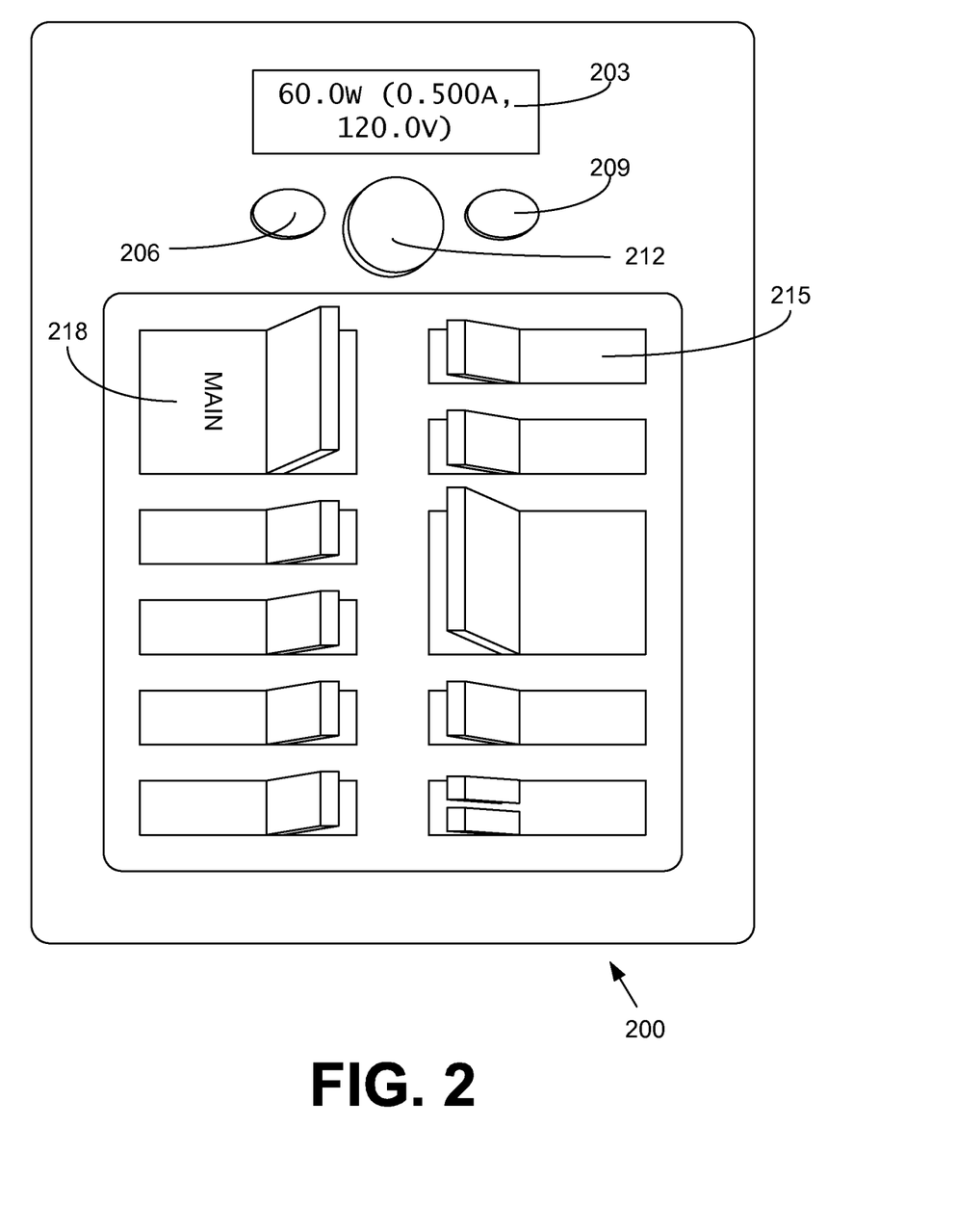
FIG. 2 is a drawing of a power monitoring system according to another embodiment of the present disclosure.

Referring next to FIG. 2, shown is a power monitoring system 200 according to another embodiment. The power monitoring system 200 is illustrated as an electrical service panel. The power monitoring system 200 includes a display 203, buttons 206 and 209, a control 212, and a plurality of circuit breakers 215. The plurality of circuit breakers 215 may include one or more main breakers 218. In other embodiments, the power monitoring system 200 may comprise, for example, fuses in place of the circuit breakers 215. The power monitoring system 200 is configured to monitor the power flowing through one or more circuits associated with one or more of the circuit breakers 215. As shown, the power monitoring system 200 may be an integral component of the electrical service panel. In another embodiment, the power monitoring system 200 may comprise a device configured to fit on top of or around a circuit breaker 215.

The display 203 may be configured to display, for example, status information about the power used through the monitored circuit or circuits. Such status information may include, but is not limited to, power drawn, current drawn, voltage of the power connection, an active power consumption mode, a time associated with an active power consumption mode, and/or other status information. The display 203 may also display configuration information when the power monitoring system is being configured. Buttons 206, 209 and control 212 are provided in order to configure and control the operation of the power monitoring system 200. In one embodiment, the control 212 may be a rotary selector mechanism. It is understood that the power monitoring system 200 may comprise any number of user input devices, including, but not limited to, touch screens, voice recognition systems, keyboards, keypads, buttons, selectors, etc. In one embodiment, a user input device may be provided in order to specify which of the circuits may be monitored by the power monitoring system 200.

Figure 3:
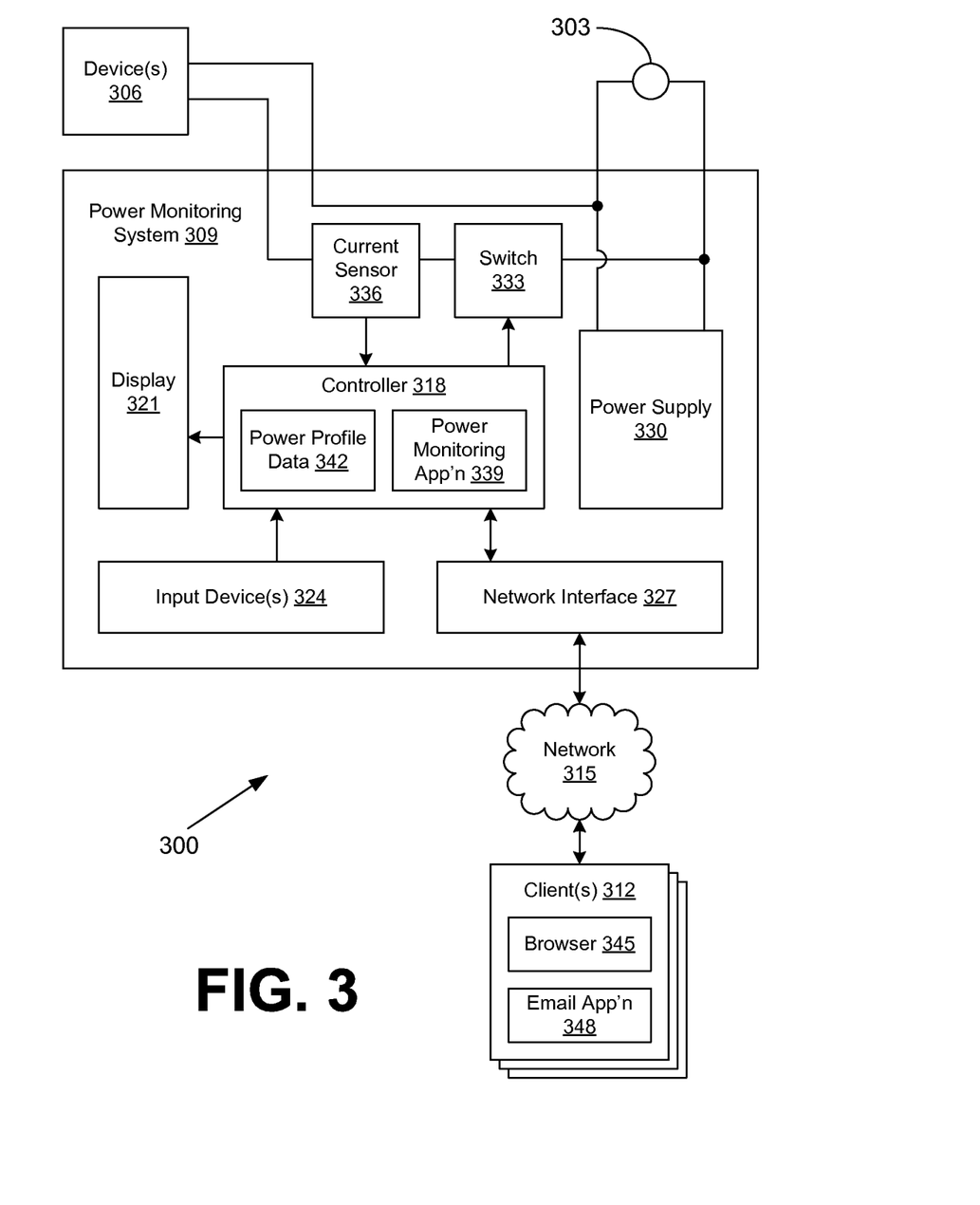
FIG. 3 is a drawing of a power monitoring environment according to various embodiments of the present disclosure.

Turning now to FIG. 3, shown is a power monitoring environment 300 according to various embodiments. The power monitoring environment 300 includes a power source 303, one or more devices 306, a power monitoring system 309, and one or more clients 312 in data communication with the power monitoring system 309 by way of a network 315. The network 315 includes, for example, the Internet, intranets, extranets, wide area networks (WANs), local area networks (LANs), wired networks, wireless networks, or other suitable networks, etc., or any combination of two or more such networks.

The power source 303 may comprise a connection to line power, which, as a non-limiting example, may be single-phase, 120 V, 60 Hz, alternating-current line power. It is understood that the line power supplied by the power source 303 may comprise multiple phases, direct current, a different voltage, etc. as desired to power the device 306. The device 306 corresponds to any electrical device that may be monitored by the power monitoring system 309. In some embodiments, the device 306 may correspond to a circuit including multiple devices 306.

The power monitoring system 309 may correspond, for example, to the power monitoring system 100 (FIG. 1), the power monitoring system 200 (FIG. 2), or some other embodiment. The power monitoring system 309 includes a controller 318, a display 321, one or more input devices 324, a network interface 327, a power supply 330, a switch 333, a current sensor 336, and/or potentially other components.

The controller 318 may comprise a microcontroller, including a microprocessor and integrated memory. In other embodiments, the controller 318 may comprise, for example, a computer or any other computing device or system providing computing capability. The controller 318 may represent multiple computer systems arranged, for example, in one or more banks or other arrangements. To this end, the controller 318 may comprise, for example, a cloud computing resource, a grid computing resource, and/or any other distributed computing arrangement. Such computer systems may be located in a single installation or may be dispersed among many different geographical locations. In one embodiment, the controller 318 represents a virtualized computer system executing on one or more physical computing systems. For purposes of convenience, the controller 318 is referred to herein in the singular. However, in one embodiment, the controller 318 represents a plurality of computer systems arranged as described above.

Various applications and/or other functionality may be executed in the controller 318 according to various embodiments. The components executed on the controller 318, for example, include a power monitoring application 339 and other applications, services, processes, systems, engines, or functionality not discussed in detail herein. The power monitoring application 339 is executed to monitor the power usage of the device 306 and to perform actions as appropriate based on the power usage of the device 306. In some embodiments, the power monitoring application 339 may include a network page server and may be capable of generating network pages, such as web pages. The power monitoring application 339 may store data in power profile data 342. The data stored in the power profile data 342 includes, for example, configuration data, current draw values, power profile thresholds, and potentially other data.

The display 321 may correspond to the display 103 (FIG. 1), the display 203 (FIG. 2), or some other display. The display 321 may comprise an liquid crystal display (LCD) screen, a plasma display, a cathode ray tube (CRT), a light emitting diode (LED) array, and/or any other type of display. The input devices 324 may correspond to the buttons 106, 109, 206, 209 (FIGS. 1 & 2), the controls 112, 212 (FIGS. 1 & 2), and/or any other type of input device, such as a keyboard, touchscreen, keypad, toggle, voice recognition interface, etc.

The network interface 327 may comprise an Ethernet interface, a wireless interface (e.g., 802.11), a fiber-optic interface, and/or any other type of interface that may be used to communicate with a client 312 and/or other power monitoring systems 309.

The power supply 330 may comprise, for example, a direct current power supply. In some embodiments, the power supply 330 may comprise a battery power source. The power supply 330 may supply differing voltages as desired to power various components of the power monitoring system 309. In one embodiment, the power supply 330 supplies 8 V unregulated and 5 V regulated from line power. The 5 V supply may be used for powering the switch 333, the display 321, and/or other components as desired. The 5 V supply may not protected from power failure in various embodiments.

The 8 V unregulated may be fed into the input of a 5 V regulator. The output of this 5 V regulator may be connected to a capacitor (e.g., a 3 farad capacitor). This capacitor charges when the invention is connected to a power source 303 and discharges on disconnect, releasing its stored energy. Every component branched off this supply may be protected from power failure. The output may also be connected to logic power of the display 321 and to a 3.3 V regulator. The output of this 3.3 V regulator may, for example, power the controller 318, the network interface 327, the current sensor 336, and/or other components as desired.

The switch 333 may comprise any type of relay or switch that may be used to interrupt the connection between the power source 303 and the device 306. As shown in the embodiment of FIG. 3, the hot conductor from the power source 303 is switched by the switch 333, but the neutral conductor from the power source 303 may be also switched in other embodiments. The switch 333 may be actuated by the controller 318 or may be actuated according to other logic.

The current sensor 336 may comprise, for example, a Hall effect sensor and may function by passing current through a small shunt and measuring the modification of the magnetic field at the shunt. The change in magnetic field may be analyzed by a small microprocessor that generates a signal. In one embodiment, 0 A may be equal to 1.65 V (half of 3.3 V), +20 A equal to 3.3 V and −20 A is equal to 0 V. The output may be a linear relationship from −20 A to +20 A of the input which is displayed as 0 to 3.3 V output. The output of the current sensor 336 is connected to the controller 318. The controller 318 can use the current sensor 336 to determine how much current that the load is drawing. Although the current sensor 336 is shown as reading the current flowing through the hot conductor that is supplied to the device 306, the current sensor 336 may read the current flowing through the neutral conductor that is supplied to the device 306. In some embodiments, the current sensor 336 may read both conductors.

The client 312 is representative of a plurality of client devices that may be coupled to the network 315. The client 312 may comprise, for example, a processor-based system such as a computer system. Such a computer system may be embodied in the form of a desktop computer, a laptop computer, a personal digital assistant, a cellular telephone, set-top box, music players, web pads, tablet computer systems, or other devices with like capability.

The client 312 may be configured to execute various applications such as a browser 345, an email application 348, and/or other applications. The browser 345 may be executed in a client 312, for example, to access and render network pages, such as web pages, or other network content served up by the controller 318 and/or other servers. The email application 348 may be executed in a client 312, for example, to read and send email messages. The client 312 may be configured to execute applications beyond browser 345 and email application 348 such as, for example, instant message applications and/or other applications.

Next, a general description of the operation of the various components of the power monitoring environment 300 is provided. To begin, a user configures the operation of the power monitoring application 339 when desired. To this end, the user may configure the operation of the network interface 327 and the various actions to perform when the power monitoring application 339 detects an abnormal power reading. A user may supply email configuration settings so that the power monitoring application 339 may send out email. The configuration of the power monitoring application 339 may occur using the input devices 324 of the power monitoring system 309 or may occur though a network page, such as a web page, generated by the power monitoring application 339 and served up to the client 312.

The user then enables the power monitoring application 339 to monitor the power usage of a power connection. For example, the user may plug a device 306 into receptacle 115 (FIG. 1) or into a circuit being monitored by the power monitoring system 309.

In some embodiments, the controller 318 may not be able to accept signals under 0 V or over 3.3 V. In such embodiments, the current sensor 336 may supply a waveform that is biased +1.65 V, which may be half of the input voltage of the controller 318 and current sensor 336. Biasing the signal allows the controller 318 to view the full waveform. Software rectification is used to generate a static current value. This may be achieved by collecting some number of data points (e.g., 1000) from the current sensor 336 using an analog to digital converter that may be built into the controller 318. All of the data points may then be averaged together to generate a center point of the waveform. The absolute value of the waveform may be taken using the center point to determine which values are negative. These may be then averaged and then multiplied by a number which is determined on calibration. The result of this multiplication is current.

This current value may then be compared to the previous result from the process above. If the previous value is within some threshold (e.g., 2%) of the new value, the new value may be discarded. If not, this new value may be stored in a portion of the power profile data 342, and may be tagged with date and time. Once a predetermined number of values are collected, these values may be stored in a portion of the power profile data 342.

In some embodiments, when the controller 318 powers on there may be a pause to wait for the backup capacitor to charge. This may also allow time for the device plugged into the invention to power up. As soon as the pause ends, the power monitoring application 339 reads the power profile data 342. If there are no power profile parameters in the power profile data 342, the power monitoring application 339 may enter learning mode. Learning mode may also be manually invoked using, for example, an input device 324. In some embodiments, invoking learning mode may result in a discarding of parameters pertaining to the device 306.

If the power monitoring application 339 is set in a constant mode, the power monitoring application 339 may monitor the power connection for a predetermined time, such as, for example, 15 minutes or some other time period. The power monitoring application 339 reads current values from the current sensor 336, recording the highest and lowest peaks. A value greater than the high peak by a threshold (e.g., 10 percent) and less than the low peak by a threshold (e.g., 10 percent) may be stored in power profile data 342. Learning mode may then be terminated.

If the power monitoring application 339 is configured for a timed, non-constant mode, the power monitoring application 339 will monitor the device 306 for a predetermined time period, watching the device 306 cycle between different levels of current draw. If the device is consistently drawing an amount of current that does not deviate from a threshold (e.g., 10 percent) above or below the initial value for more than a predetermined time period (e.g., three days), the power monitoring application 339 may switch to constant mode, and learning mode may be invoked. If the power monitoring application 339 can find two or more discrete levels of current draw (i.e., multiple current draw periods), it will record the amount of current drawn during each of the discrete levels. Where there are two discrete levels, the time spent in high current draw may be considered as running time, while the time spent in low current draw may be considered as off time.

These times may be recorded for some number of cycles between high and low current values. After the power cycles have been observed, the running time, off time, high values, and low values may be averaged for the power usage cycles. Thresholds are computed for the current levels and the durations of current draw and are stored in the power profile data 342. Learning mode may be terminated. If any of these threshold values are met, the current draw reading may be considered abnormal and a malfunction of the device 306 may have occurred. In some embodiments, a series of current draw readings meeting the threshold values may be required before a current draw reading is considered abnormal.

In another embodiment, the power monitoring application 339 may be configured to monitor the device 306 based in part on parameters obtained from the client 312 or some other system. As a non-limiting example, power profile data 342 may include predetermined profile data for various devices 306. In one embodiment, the predetermined profile data may be hosted by a centralized server in data communication with any number of power monitoring systems 309. In such a case, the power monitoring application 339 may be configured to obtain such predetermined profile data based, for example, on a user selection. In one embodiment, when no matches are found for a particular device 306, the power monitoring application 339 may be configured to enter a learning mode.

Providing profile data for devices 306 by way of a centralized server may have several advantages. For example, data collected from many power monitoring systems 309 for a type of device 306 may be aggregated and processed at the centralized server, making the operational characteristics of the type of device 306 more clearly defined. This may allow the deviation between thresholds to be decreased, thereby leading to increased detection of malfunctions for the type of device 306.

Further, certain changes of device 306 power usage characteristics may be observed seasonally, such as, for example, how long a refrigerator is running. With a centralized server aggregating profile data, the changes may be observed among many matching devices 306. Power profile parameters used by the power monitoring application 339 may be updated based in part on these seasonal changes, permitting the power monitoring application 339 to recognize changes in the power usage of the device 306 as resulting from the environment and not a malfunction of the device 306.

In various embodiments, a centralized server may permit users at clients 312 to compare power usage schedules of their devices 306 with those for the identical devices 306 of others, thereby allowing users to see how relatively efficient their device 306 is. Such comparisons may be grouped together by location of the device 306. Locations may be determined according to a location parameter (e.g., street address, coordinates, zip codes, etc.) entered for the power monitoring systems 309 or determined automatically according, for example, to geolocation of Internet protocol (IP) addresses or global positioning system (GPS) data. This possibility of device 306 comparison may allow users to shop for, and potentially purchase, energy-efficient devices 306. In one embodiment, the centralized server is configured to generate network pages that include links to purchase the energy-efficient devices 306.

When a malfunction of the device 306 is determined by the power monitoring application 339 to have occurred (that is, when a current draw reading from the current sensor 336 is abnormal), the power monitoring application 339 may be configured to perform some action. As a non-limiting example, the power monitoring application 339 may be configured to disable the power connection to the device 306. To this end, the power monitoring application 339 may control the switch 333 to open the circuit.

Additionally, the power monitoring application 339 may be configured to send a notification to a user by email, text message, telephone call, and/or by some other communication method. To send an email, the power monitoring application 339 may generate a message describing the detected abnormality or malfunction and send the message to the over the network 315 to a preconfigured email address. The message may, for example, contain a time, a number of Watts or Amps flowing to the device, the thresholds, and/or other information. In some embodiments, part of this functionality may be performed on some base station computer system accessible to the network interface 327. The user is able to read the email with the email application 348.

Further, the power monitoring application 339 may record the abnormality or malfunction within a log file in the power profile data 342. When a user logs into the power monitoring system 309 by way of the browser 345, a graph, textual description, and/or some other interface may display the error within a network page.

The user may be able to cause an action to be performed in response to the abnormality, such as disabling the device 306 by commanding the controller 318 to deactivate the circuit supplying power to the device 306 through the use of the switch 333. Such a command may be provided to the controller 318 from the input device 324 or over the network 315 from the client 312.

In various embodiments, the power monitoring application 339 and the power profile data 342 may be updated over the network 315. In some embodiments, the controller 318 may be configured to execute power monitoring applications 339 and/or store power profile data 342 provided by third parties.

Figure 4:
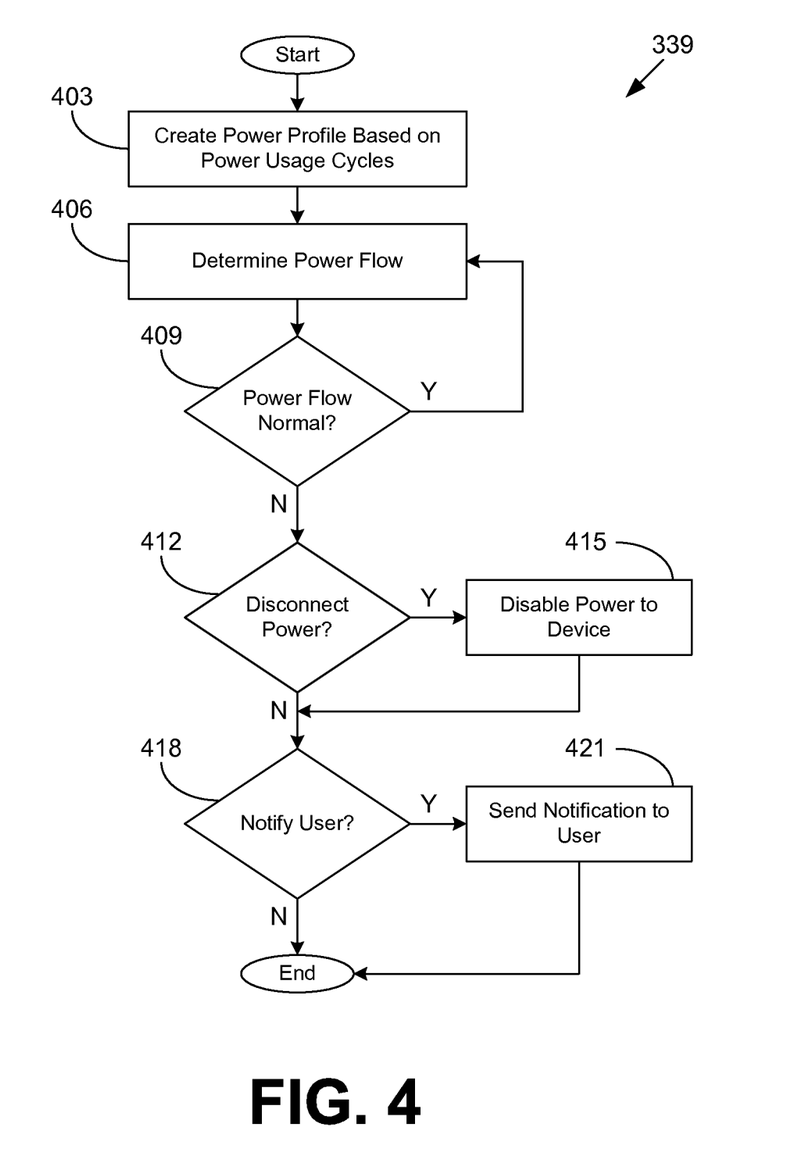
FIG. 4 is a flowchart illustrating one example of functionality implemented as portions of a power monitoring application executed in a power monitoring system in the power monitoring environment of FIG. 1 according to various embodiments of the present disclosure.

Referring next to FIG. 4, shown is a flowchart that provides one example of the operation of a portion of the power monitoring application 339 according to various embodiments. It is understood that the flowchart of FIG. 4 provides merely an example of the many different types of functional arrangements that may be employed to implement the operation of the portion of the power monitoring application 339 as described herein. As an alternative, the flowchart of FIG. 4 may be viewed as depicting an example of steps of a method implemented in the controller 318 (FIG. 3) according to one or more embodiments.

Beginning with box 403, the power monitoring application 339 creates a power profile based on some number of power usage cycles associated with the device 306. In other words, the power monitoring application 339 enters a learning mode and learns how the device 306 behaves with respect to current draw. Some devices 306 may draw a constant level of current, while other devices 306 may draw differing levels of current at different times, which may be predictable. Based on the observed current draw, the power monitoring application 339 generates thresholds computed relative to the average current draw reading, root-mean-square (RMS) current draw reading, peak current draw reading, and/or some other computation. In some embodiments, the thresholds may be defined by a user through a configuration process.

In box 406, the power monitoring application 339 determines a power flow to the device 306 using the current sensor 336. Thereafter, in box 409, the power monitoring application 339 determines whether the power flow to the device 306 is normal (i.e., within predefined thresholds). If the power monitoring application 339 determines that the power flow is normal, the power monitoring application 339 returns to box 406 and reexamines the power flow.

If, in box 409, the power monitoring application 339 determines that the power flow to the device 306 is not normal, the power monitoring application 339 moves to box 412 and determines whether the power connection to the device 306 is to be disconnected. Such an action may be configurable for the power monitoring application 339 and may be performed relative to differing thresholds than the thresholds for abnormal current draw readings. If the power to the device 306 is to be disconnected, the power monitoring application 339 moves to box 415 and disables the power to the device 306.

Next, in box 418, the power monitoring application 339 determines whether to notify a user. If, in box 418, the power monitoring application 339 determines that a user is to be notified, the power monitoring application 339 moves to box 421, and sends a notification to the user. The notification may take the form of an email to a predefined email address in some embodiments. Thereafter, the power monitoring application 339 ends.

Figure 5:
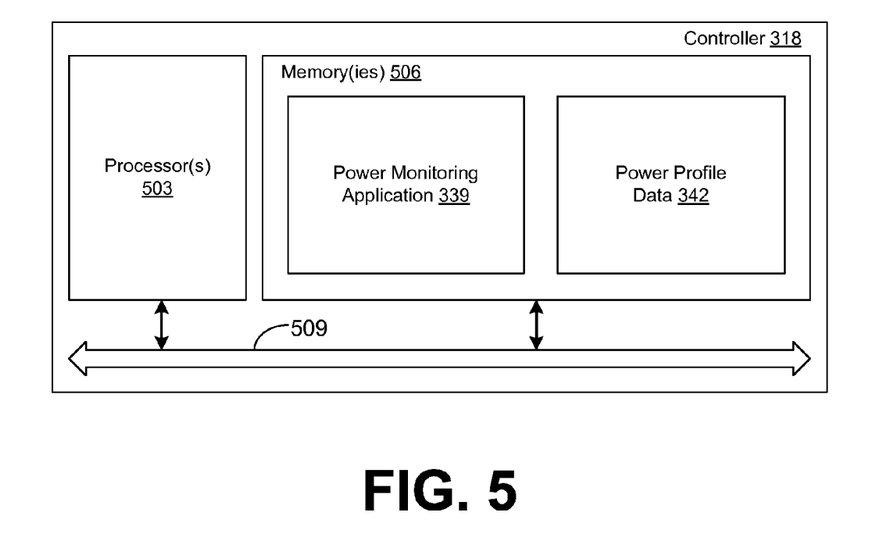
FIG. 5 is a schematic block diagram that provides one example illustration of a controller employed in the power monitoring environment of FIG. 3 according to various embodiments of the present disclosure.

With reference to FIG. 5, shown is a schematic block diagram of the controller 318 according to an embodiment of the present disclosure. The controller 318 includes at least one processor circuit, for example, having a processor 503 and a memory 506, both of which are coupled to a local interface 509. To this end, the controller 318 may comprise, for example, at least one server computer or like device. The controller 318 may also comprise a microcontroller and may be integrated onto one chip in various embodiments. The local interface 509 may comprise, for example, a data bus with an accompanying address/control bus or other bus structure as can be appreciated.

Stored in the memory 506 are both data and several components that are executable by the processor 503. In particular, stored in the memory 506 and executable by the processor 503 are a power monitoring application 339 and potentially other applications. Also stored in the memory 506 may be power profile data 342 and other data. In addition, an operating system may be stored in the memory 506 and executable by the processor 503.

It is understood that there may be other applications that are stored in the memory 506 and are executable by the processors 503 as can be appreciated. Where any component discussed herein is implemented in the form of software, any one of a number of programming languages may be employed such as, for example, C, C++, C#, Objective C, Java, Java Script, Perl, PHP, Visual Basic, Python, Ruby, Delphi, Flash, or other programming languages.

A number of software components are stored in the memory 506 and are executable by the processor 503. In this respect, the term "executable" means a program file that is in a form that can ultimately be run by the processor 503. Examples of executable programs may be, for example, a compiled program that can be translated into machine code in a format that can be loaded into a random access portion of the memory 506 and run by the processor 503, source code that may be expressed in proper format such as object code that is capable of being loaded into a random access portion of the memory 506 and executed by the processor 503, or source code that may be interpreted by another executable program to generate instructions in a random access portion of the memory 506 to be executed by the processor 503, etc. An executable program may be stored in any portion or component of the memory 506 including, for example, random access memory (RAM), read-only memory (ROM), hard drive, solid-state drive, USB flash drive, memory card, optical disc such as compact disc (CD) or digital versatile disc (DVD), floppy disk, magnetic tape, or other memory components.

The memory 506 is defined herein as including both volatile and nonvolatile memory and data storage components. Volatile components are those that do not retain data values upon loss of power. Nonvolatile components are those that retain data upon a loss of power. Thus, the memory 506 may comprise, for example, random access memory (RAM), read-only memory (ROM), hard disk drives, solid-state drives, USB flash drives, memory cards accessed via a memory card reader, floppy disks accessed via an associated floppy disk drive, optical discs accessed via an optical disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

Also, the processor 503 may represent multiple processors 503 and the memory 506 may represent multiple memories 506 that operate in parallel processing circuits, respectively. In such a case, the local interface 509 may be an appropriate network 315 (FIG. 3) that facilitates communication between any two of the multiple processors 503, between any processor 503 and any of the memories 506, or between any two of the memories 506, etc. The local interface 509 may comprise additional systems designed to coordinate this communication, including, for example, performing load balancing. The processor 503 may be of electrical or of some other available construction.

Although the power monitoring application 339 and other various systems described herein may be embodied in software or code executed by general purpose hardware as discussed above, as an alternative the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, or other components, etc. Such technologies are generally well known by those skilled in the art and, consequently, are not described in detail herein.

The flowchart of FIG. 4 shows the functionality and operation of an implementation of portions of the power monitoring application 339. If embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor 503 in a computer system or other system. The machine code may be converted from the source code, etc. If embodied in hardware, each block may represent a circuit or a number of interconnected circuits to implement the specified logical function(s).

Although the flowchart of FIG. 4 shows a specific order of execution, it is understood that the order of execution may differ from that which is depicted. For example, the order of execution of two or more blocks may be scrambled relative to the order shown. Also, two or more blocks shown in succession in FIG. 4 may be executed concurrently or with partial concurrence. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Also, any logic or application described herein, including the power monitoring application 339, that comprises software or code can be embodied in any computer-readable medium for use by or in connection with an instruction execution system such as, for example, a processor 503 in a computer system or other system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system. The computer-readable medium can comprise any one of many physical media such as, for example, electronic, magnetic, optical, electromagnetic, infrared, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, the following is claimed:

1. An apparatus for monitoring power usage, comprising:
a power receptacle;
a power plug;
a current sensor configured to read current drawn through the power receptacle; and
a controller configured to execute a program, the program comprising:
logic that generates power profile data indicating a plurality of automatically detected current draw periods, the power profile data being generated based at least in part on monitoring current draw with the current sensor when a learning mode is active;
logic that determines that one of the automatically detected current draw periods is active based at least in part on the power profile data;
logic that determines that a current draw reading is abnormal when the current draw reading meets a threshold associated with the one of the automatically detected current draw periods that is active; and
logic that performs an action when the current draw reading is determined to be abnormal.

2. The apparatus of claim 1, wherein the program further comprises logic that determines that a current draw reading is abnormal when the current draw reading meets a predetermined duration associated with the one of the automatically detected current draw periods.

3. The apparatus of claim 1, wherein the threshold is set relative to an average current draw of the one of the automatically detected current draw periods.

4. The apparatus of claim 1, wherein the threshold is set relative to a peak current draw of the one of the automatically detected current draw periods.

5. The apparatus of claim 1, wherein the automatically detected current draw periods comprise a low current draw period and a high current draw period.

6. The apparatus of claim 1, wherein an individual one of the automatically detected current draw periods is associated with a low threshold and a high threshold.

7. The apparatus of claim 1, wherein the action comprises disabling a connection between the power plug and the power receptacle.

8. The apparatus of claim 1, wherein the action comprises alerting a user.

9. The apparatus of claim 1, wherein the program further comprises logic that generates a network page including a status of a power connection.

10. The apparatus of claim 1, further comprising a wireless network transceiver.

11. The apparatus of claim 1, further comprising an input device, wherein the learning mode is invoked by the input device.

12. The apparatus of claim 1, wherein the program further comprises logic that enters the learning mode in response to determining that the power profile data has not been generated.

13. The apparatus of claim 1, wherein the learning mode is exited prior to the current draw reading being determined to be abnormal.

14. An apparatus for monitoring power usage, comprising:
a current sensor in a service panel configured to read current drawn through a circuit in the service panel; and
a controller configured to execute a program, the program comprising:
logic that generates power profile data indicating a plurality of automatically detected current draw periods, the power profile data being generated based at least in part on monitoring current draw with the current sensor when a learning mode is active;
logic that determines that one of the automatically detected current draw periods is active based at least in part on the power profile data;
logic that determines that a current draw reading is abnormal when the current draw reading meets a threshold associated with the one of the automatically detected current draw periods that is active; and
logic that performs an action when the current draw reading is determined to be abnormal.

15. A system, comprising:
a controller; and
a power monitoring application executable in the controller, the power monitoring application comprising:

logic that generates power profile data indicating a plurality of automatically detected current draw periods for a power connection, the power profile data being generated based at least in part on monitoring current draw via the power connection when a learning mode is active;

logic that determines that one of the automatically detected current draw periods is active based at least in part on the power profile data;

logic that determines that a current draw reading is abnormal when the current draw reading meets a threshold associated with the one of the automatically detected current draw periods that is active; and logic that performs an action when the current draw reading is determined to be abnormal.

16. The system of claim 15, wherein the power monitoring application further comprises logic that determines that a current draw reading is abnormal when the current draw reading meets a predetermined duration associated with the one of the automatically detected current draw periods.

17. The system of claim 15, wherein the threshold is set relative to an average current draw of the one of the automatically detected current draw periods.

18. The system of claim 15, wherein the threshold is set relative to a peak current draw of the one of the automatically detected current draw periods.

19. The system of claim 15, wherein the automatically detected current draw periods comprise a low current draw period and a high current draw period.

20. The system of claim 15, wherein an individual one of the automatically detected current draw periods is associated with a low threshold and a high threshold.

21. The system of claim 15, wherein the power connection connects a device to single-phase, alternating-current line power.

22. The system of claim 15, wherein the power connection is a circuit in a service panel.

23. The system of claim 15, wherein the current draw reading is generated by a Hall effect current sensor coupled to the power connection.

24. The system of claim 15, wherein the action comprises disabling the power connection.

25. The system of claim 15, wherein the action comprises alerting a user.

26. The system of claim 25, wherein the alerting comprises sending an email to the user.

27. The system of claim 25, wherein the alerting comprises sending an email to the user through a wireless network connection.

28. The system of claim 15, wherein the power monitoring application further comprises logic that generates a network page including a status of the power connection.

29. A system, comprising:

means for generating power profile data indicating a plurality of automatically detected current draw periods, the power profile data being generated based at least in part on monitoring current draw when a learning mode is active;

means for determining that one of the automatically detected current draw periods is active based at least in part on the power profile data;

means for determining that a current draw reading is abnormal when the current draw reading meets a threshold associated with the one of the automatically detected current draw periods that is active; and means for performing an action when the current draw reading is determined to be abnormal.

30. A method, comprising:

generating, in at least one computing device, power profile data indicating a plurality of automatically detected current draw periods associated with a monitored device, the power profile data being generated based at least in part on monitoring current draw from the monitored device when a learning mode is active;

determining, in the at least one computing device, that one of the automatically detected current draw periods is active based at least in part on the power profile data;

determining, in the at least one computing device, that a current draw reading is abnormal when the current draw reading meets a threshold associated with the one of the automatically detected current draw periods that is active; and performing, in the at least one computing device, an action when the current draw reading is determined to be abnormal.

31. The method of claim 30, further comprising obtaining a portion of the power profile data from at least one server.

32. The method of claim 30, further comprising:

identifying the monitored device; and obtaining a portion of the power profile data from at least one server based at least in part on the identification of the monitored device.

* * * * *